US012341536B2

(12) United States Patent
Zucchetto et al.

(10) Patent No.: US 12,341,536 B2
(45) Date of Patent: Jun. 24, 2025

(54) COMPRESSION OF MULTIMODAL SENSED SIGNALS

(71) Applicant: Eaton Intelligent Power Limited, Dublin (IE)

(72) Inventors: Daniel Zucchetto, Dublin (IE); Johannes Van De Belt, Dublin (IE); Niall Cahill, Dublin (IE); Keith Nolan, Westmeath (IE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 18/255,291

(22) PCT Filed: Dec. 2, 2020

(86) PCT No.: PCT/EP2020/084341
§ 371 (c)(1),
(2) Date: May 31, 2023

(87) PCT Pub. No.: WO2022/117183
PCT Pub. Date: Jun. 9, 2022

(65) Prior Publication Data
US 2024/0097702 A1    Mar. 21, 2024

(51) Int. Cl.
*H03M 7/30* (2006.01)
(52) U.S. Cl.
CPC ....... *H03M 7/3068* (2013.01); *H03M 7/3059* (2013.01)
(58) Field of Classification Search
None
See application file for complete search history.

(56) References Cited

U.S. PATENT DOCUMENTS

| | | | | |
|---|---|---|---|---|
| 5,745,392 A | * | 4/1998 | Ergas | G01V 1/22 |
| | | | | 702/14 |
| 7,076,108 B2 | * | 7/2006 | Huang | H04N 19/635 |
| | | | | 382/245 |

(Continued)

FOREIGN PATENT DOCUMENTS

| | | | | |
|---|---|---|---|---|
| GB | 2325368 A | * | 11/1998 | G06T 9/007 |
| WO | WO-2014139261 A1 | * | 9/2014 | G06F 3/1454 |
| WO | WO-2020119998 A1 | * | 6/2020 | |
| WO | 2020/197526 A1 | | 10/2020 | |

OTHER PUBLICATIONS

Jeremy Jordan; Mar. 19, 2018; 'Introduction to autoencoders'; retrieved online from https://www.jeremyjordan.me/autoencoders/ (Year: 2018).*

(Continued)

*Primary Examiner* — Sandarva Khanal
(74) *Attorney, Agent, or Firm* — LEYDIG, VOIT & MAYER, LTD.

(57) ABSTRACT

A data transmission and compression method arranged to compress and transmit data between an edge device and a remote server. The method includes collecting data at the edge device, wherein the data is attributed to a plurality of signal signatures, generating a data matrix at the edge device, and transforming the data matrix, wherein transforming the data includes using a wavelet transform. The method further includes compressing the data, wherein compressing the data includes utilising an autoencoder, and transmitting the encoded compressed data to the remote server via a communication channel. The method further includes, at the remote server, decompressing the data utilising an autoencoder, reconstructing the signal signatures using an inverse wavelet transform, and storing the reconstructed data signatures in a datastore on the remote server.

11 Claims, 8 Drawing Sheets

(56) References Cited

U.S. PATENT DOCUMENTS

| | | | | |
|---|---|---|---|---|
| 8,154,985 | B1* | 4/2012 | Smith, Jr. | H03M 7/3068 370/210 |
| 8,731,281 | B2* | 5/2014 | Dong | H04N 23/84 382/162 |
| 9,190,844 | B2* | 11/2015 | Tran | G06Q 50/163 |
| 10,740,310 | B2* | 8/2020 | Gawlick | G06F 11/3072 |
| 2006/0291735 | A1* | 12/2006 | Hou | H04N 19/63 375/E7.044 |
| 2009/0034624 | A1* | 2/2009 | Bar-On | H04N 19/62 375/E7.193 |
| 2009/0041365 | A1* | 2/2009 | Meany | H04N 19/48 382/233 |
| 2014/0095768 | A1* | 4/2014 | Kipnis | H03M 7/3077 711/170 |
| 2016/0112227 | A1* | 4/2016 | Kawakami | G06F 17/145 375/259 |
| 2020/0177200 | A1* | 6/2020 | Fenney | G06N 3/04 |
| 2020/0242772 | A1* | 7/2020 | Song | G06T 7/155 |
| 2022/0109454 | A1* | 4/2022 | Martin de Los Santos | G06F 3/0659 |

OTHER PUBLICATIONS

Li et al.; 2019 IEEE; 'Load Data Compression Based on Integrated Neural Network Model; 978-1-7281-0106-4/19; p. 6203-6209 (Year: 2019).*

Li et al.; "Wavelet Transform and Stacked Sparse Autoencoder Network Based Location Method of Cable Incipient Fault"; International Conference on Computer, Network, Communication and Information Systems (CNCI 2019); Advances in Computer Science Research, Atlantis Press; vol. 88; p. 500-509 (Year: 2019).*

Skowron et al.; "Convolutional Neural Network-Based Stator Current Data-Driven Incipient Stator Fault Diagnosis of Inverter-Fed Induction Motor"; Published: Mar. 20, 2020; Energies 2020, 13, 1475; doi:10.3390/en13061475 (Year: 2020).*

StackExchange, May 2019, 'Is it possible for a neural network to be used to compress data'; retrieved online from https://ai.stackexchange.com/questions/12565/is-it-possible-for-a-neural-network-to-be-used-to-compress-data (Year: 2019).*

Unterweger et al.; "Resumable Load Data Compression in Smart Grids" in IEEE Transactions on Smart Grid, vol. 6, No. 2, pp. 919-929; Mar. 2015; doi: 10.1109/TSG.2014.2364686. (Year: 2015).*

Jiang et al.; "Stacked Auto Encoder Based Deep Reinforcement Learning for Online Resource Scheduling in Large-Scale MEC Networks"; Apr. 14, 2020; Retrieved online on Dec. 9, 2024 from https://arxiv.org/pdf/2001.09223. (Year: 2020).*

Cao et al.; "Hybrid Deep Learning Model Assisted Data Compression and Classification for Efficient Data Delivery in Mobile Health Applications"; IEEE Access vol. 8 pp. 94757-94766; May 18, 2020; Digital Object Identifier 10.1109/ACCESS.2020.2995442; (Year: 2020).*

* cited by examiner

COMPRESSION OF MULTIMODAL SENSED SIGNALS

FIELD OF INVENTION

The field of this invention relates to data compression techniques for transmitting large amounts of information over one or more networks, with the information comprising measured multimodal signals of one or more devices such as, for example, in Eaton's PowerGenome architecture.

BACKGROUND

Optimising power systems has become a prominent focus in recent years in order to improve the efficiency, cost, and power requirements of such systems. Determining the relationship between different signals from different devices within the power system network allows for the optimisation of such systems to be achieved. Various benefits can be gained by collating all the signal information of a power system and depending on the application can lead to a more advanced control of certain devices. An example of such a system is the PowerGenome architecture, where the assembly of all measured data within the system is compiled into a single database. However, in order to optimise such a system, like PowerGenome, large amounts of data need to be collected from a plurality of different sources. Typically in a PowerGenome-type application a plurality of different signals are measured at each of the plurality of devices connected within the system. These signals are typically recorded as high-resolution raw data from measurements taken by, for example, a sensor device and collated together in order to establish relationships between the devices within the system. Therefore, these types of applications require large amounts of computing power, storage and high transmission bandwidth capabilities for effective operation. The higher the complexity of the system, the more data that needs to be recorded, and thus higher computing power and transmission means are needed to facilitate this type of power system.

However, the problem lies when trying to transmit this large quantity of data over a network, such as wirelessly streaming the data from a device to a remote server, as data bandwidths cannot meet the demand for efficient data transfer unless equipped with significant resources. This may be infeasible for economic and/or technical reasons, and therefore, puts a limitation on the application, the optimisation and the efficiency of certain power systems. In particular, streaming high-resolution raw sensor data such as in the PowerGenome architecture becomes unfeasible with state-of-the-art communication technologies.

The invention is directed at the provision of a method and system of compressing raw data signals in order to reduce the amount of data transmitted over a network. In particular, compressing a plurality of multimodal signals, such as current and voltage waveforms, from a plurality of electronic devices, to allow for transmission of large datasets from the electronic device to a remote server or cloud.

SUMMARY

The challenge of transmitting significantly large amounts of data over a network, as described above, are addressed by the present disclosure. This disclosure utilises data featurization and compression techniques to reduce the amount of data transmitted between an edge device (e.g. router, multiplexer, routing switches) or embedded device (e.g. computer system) and the cloud. This amounts to reducing the data size to be transmitted over the network by 3 or more orders of magnitude. In a preferred embodiment, the disclosure uses a combination of sparse wavelet transform and an artificial neural network, such as an autoencoder, to achieve this. In addition, the method and system disclosed provides the capability to record the data relating to the difference between subsequent signals, rather than the raw signal data. This allows more information to be stored at the edge or embedded device, before featurization and compression is performed, and reduces the computing resources required at the edge or embedded platforms. For example, in common PowerGenome-type systems the devices measure the raw current and voltage waveforms, i.e. the periodic AC signal, from intelligent circuit breakers within the device and store this data before transmitting to a server. Collating and transmitting this raw data requires an unfeasible amount of storage and communication resources. Whereas, in the present disclosure only the difference between the currently measured signal and the previously measured signal (i.e. $\Delta x$ where $x=V$ or $I$) is recorded and stored, thus reducing the need for extensive computing resources. For example, in a series of measurements, x1, x2, x3, x4, etc, only the $\Delta x$ value is recorded such that $x2=x1+\Delta x_1$, $x3=x2+\Delta x_2$, $x4=x3+\Delta x_3$. In some embodiments, the $\Delta x$ value may be different, i.e. $\Delta x_1 \neq \Delta x_2 \neq \Delta x_3$. In any case, the $\Delta x_1 \neq \Delta x_2 \neq \Delta x_3$ occupy less memory space than x1, x2, x3, x4. Further, the algorithm which implements the data featurization and compression techniques of the disclosed method uses low computational power, therefore is conducive for applications utilising edge or embedded devices.

In a preferred embodiment of the present disclosure there is provided a transmission and compression method arranged to compress and transmit data between an edge device and a remote server, comprising the steps of: collecting data at the edge device, wherein the data is attributed to a plurality of signal signatures; generating a data matrix at the edge device; transforming the data matrix, wherein transforming the data comprises using a wavelet transform; compressing the data, wherein compressing the data comprises utilising an autoencoder; transmitting the encoded compressed data to the remote server via a communication channel; the method further comprising, at the remote server, decompressing the data utilising an autoencoder; reconstructing the signal signature using an inverse wavelet transform; and storing the reconstructed data signatures in a datastore on the remote sever.

In some aspects of the disclosure the collected data signatures may comprise measurement data from a plurality of N-correlated sensors at the edge device. Collecting data from a number of correlated sensors provides a deeper insight into the operations of the system.

The data signatures may be periodic signals collected as a time-series. This provides an improved overview of the devices within the system architecture and the performance of such devices over time.

In some cases the data collected may be measured raw data, allowing a common approach to be implemented for small data sets if needed.

In some aspects of the disclosure the data recorded in the time-series is the difference value ($\Delta x$) for succeeding measurements, such that $x2=x1+\Delta x_1$, $x3=x2+\Delta x_2$, $x4=x3+\Delta x_3$, wherein $\Delta x$ can be a positive or negative integer. This reduces the overall amount of data collected and thus required to be transmitted.

In some instances the edge device may be an embedded device. Embedding the edge device in the appliance or device in use removes the need for an additional edge device to be added into the architecture.

Transmission may be over a network protocol. It will be realised that other types of communication capable of transmitting data and information may be used.

The data may be collected from an architecture, where a large amount of data belonging to a large number of devices within this architecture can then be transmitted and analysed remotely.

The step of transforming the data may be arranged to sparsify the matrix. This produces a sparse matrix which contains very few non-zero elements, reducing the density of data to be compressed and transmitted.

The autoencoder on the edge device may be a neural network with an input layer. This type of autoencoder has the aim of providing a learned representation for a set of data that is input into the autoencoder. The learned representation allows for dimensionality reduction.

The autoencoder on the remote server may be a pre-trained neural network. Having a set of pre-trained neural networks allow for improved and more efficient training of the autoencoder which will be used depending on the application.

In an aspect of the present disclosure there is provided a data transmission and compression system arranged to compress and transmit data between an edge device and a remote server, comprising: an edge device, wherein the edge device comprises: a data collector, wherein the data collector collects a plurality of data signatures; a matrix generator, wherein the data matrix generator generates a matrix of the data; a transformer, wherein the transformer transforms the data using a wavelet transform; a compressor, wherein the compressor compresses the data using an autoencoder; and a transmitter; wherein the transmitter transmits the encoded compressed data to the remote server via a communication channel; a remote server, wherein the remote server comprises: a receiver; a decompressor, wherein the decompressor decompresses the data using an autoencoder; a reconstructor, wherein the reconstructor reconstructs the data to the original signal signature using an autoencoder; and a datastore, wherein the reconstructed data signatures are stored in the data store.

BRIEF DESCRIPTION OF THE DRAWINGS

The present disclosure will now be described, by way of example only with reference to the accompanying drawings, in which.

DETAILED DESCRIPTION

Figure 1:
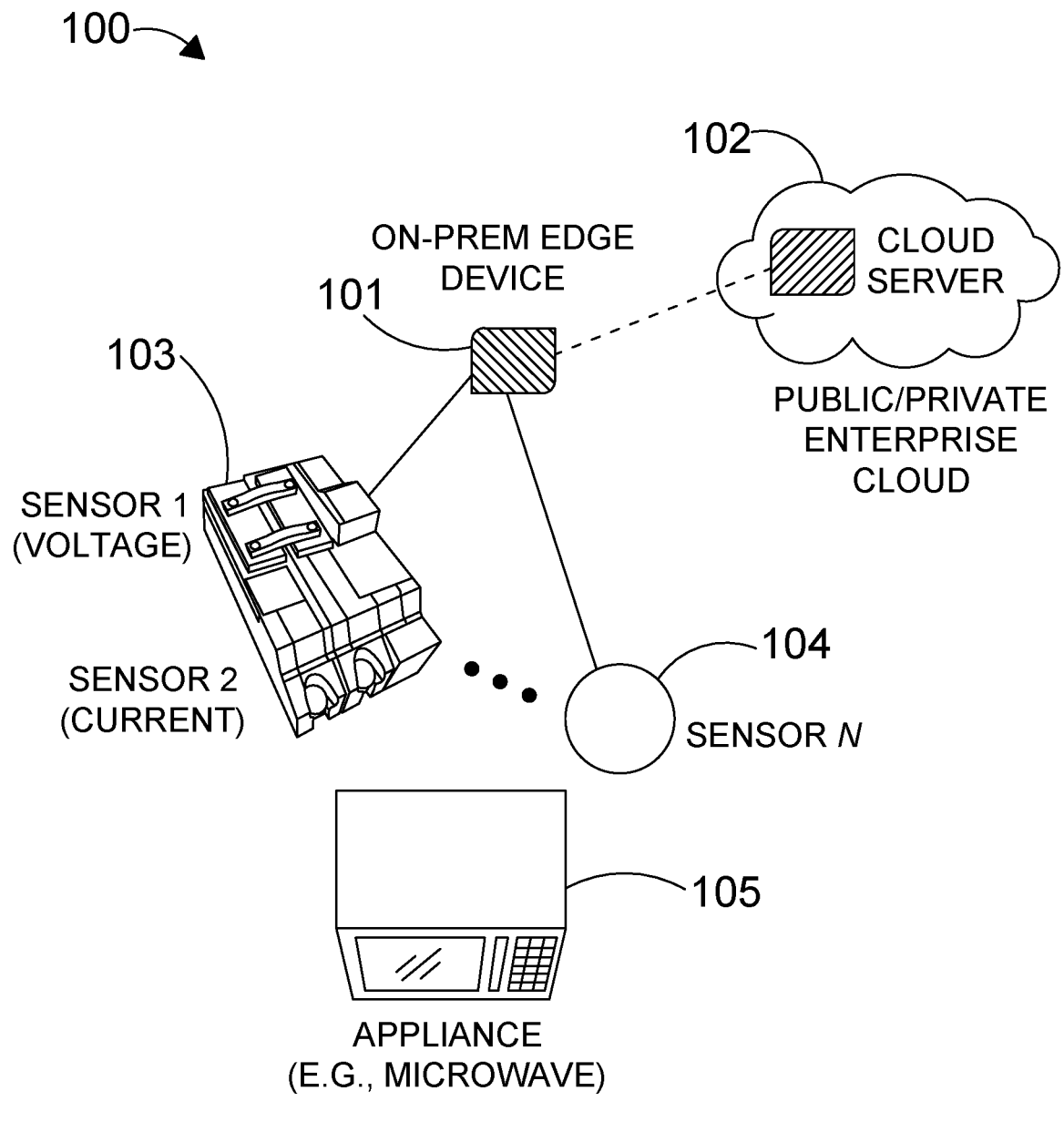
FIG. 1 is a schematic view of an example system architecture where the example device is a microwave appliance.

FIG. 1 is an example schematic showing a system architecture 100 comprising two sides of a communication channel, wherein the communication channel is a wireless network between an edge device 101 and a remote server 102. The application shown in FIG. 1 is that of transmitting data from a microwave appliance 105 to a cloud server 102. The microwave 105 has N sensors 104 for measuring the power characteristics, at least two of which are current and voltage sensors 103, and an on premises edge device 101 for transmitting the data to the cloud 102. The current and voltage sensor 103 in FIG. 1 is represented as an intelligent circuit breaker. Other sensors may be used or included in the device to collect additional information about the operation of the appliance. The edge device 101 is responsible for data collection and compression, while the remote server (i.e. cloud) 102 is responsible for data recovery and storage.

Figure 2:
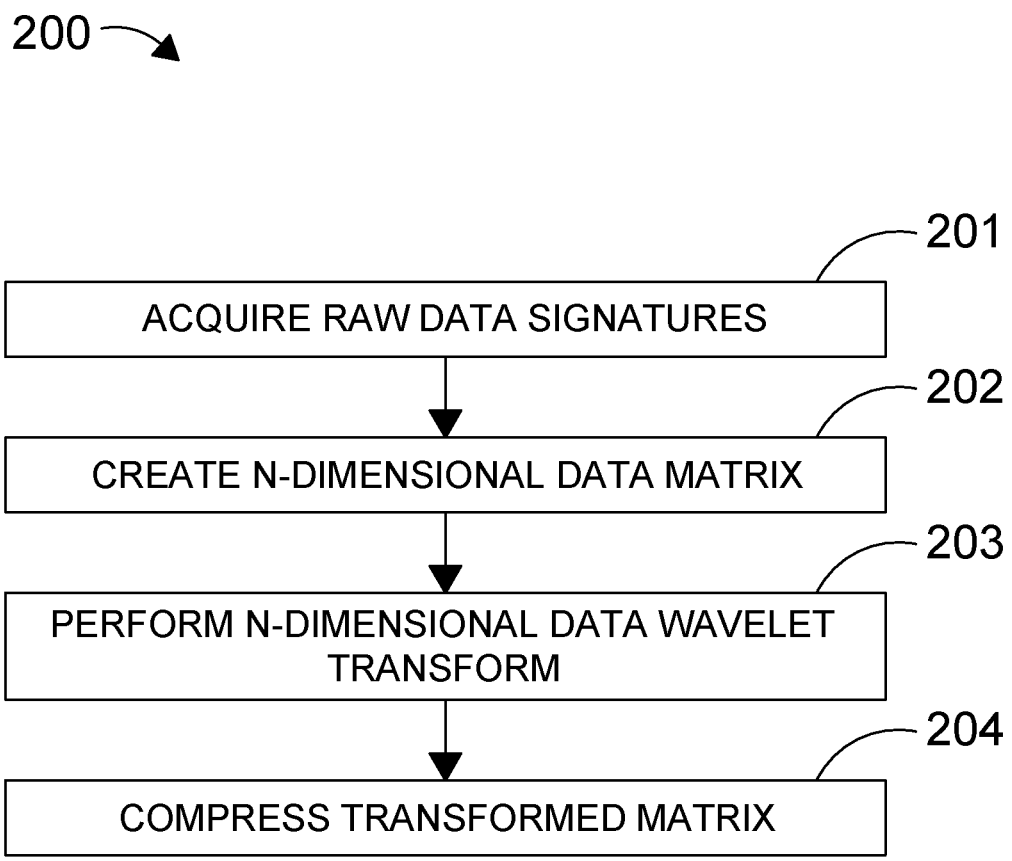
FIG. 2 is a flow diagram of the process occurring within the edge device according to the disclosure.

In use, FIG. 2 is a flow diagram of a process and operation 200 occurring at the edge device.

The first step 201 is to acquire the raw data from the sensors on the edge device. For example the current-voltage data as measured by the sensors 103 of an intelligent circuit breaker on a microwave appliance 105, as in FIG. 1. Different characteristics of different appliances may be measured concurrently from N sensors 104 on N devices that make up the system architecture 100, as in Eaton's PowerGenome. In a domestic setting, these may include, but are not limited to, appliances such as microwaves, washing machines, refrigerators, cookers, etc. In a manufacturing setting, the devices may include, but are not limited to, devices such as motors, pumps, mixers, compressors, generators, etc. The method may be applied in other settings where system architectures occur and the need for remote data processing exists.

Firstly, the edge device 101 acquires the data and creates a data matrix 202. The edge device 101 collects time-series data signatures from the N correlated sensors 104 and creates an N-dimensional matrix representation of the data (initialised to zero) as shown in 202 of FIG. 2. If the data taken at each time instant $(x_t)$ is the collected data $(x_1, x_2, x_3, \ldots, x_N)$ for each of the sensors $(1, 2, 3, \ldots, N)$, then 1 is added to a corresponding position $(x_1, x_2, x_3, \ldots, x_N)$ of the matrix, i.e. up to a max value. The data collection is performed for a predefined time duration, for example 10s of seconds, comprising N time instants. After a full window of samples is collected, i.e. $N \times (x_t)$, the values of the matrix are scaled to between 0 and 1, i.e. normalised, depending on the max value recorded.

The edge device 101 then performs two operations on the N-dimensional matrix, transformation and compression. This is illustrated in steps 203 and 204 of the flow diagram of FIG. 2. The transformation operation separates the high and low frequency components of the matrix by using an N-dimensional wavelet transform, such as the Haar transform. Other wavelet transforms may be used as will be known to the skilled addressee. The component values are resolved by applying the wavelet transform to a certain depth, which is determined depending on the application, e.g. signal and image processing. Applying the wavelet transform to the N-dimensional matrix 203 makes the signal compression 204 easier in the second of the two operations performed at the edge device 101. This is due to the high frequency signal component being readily identifiable and it can be compressed more or less than the low frequency component, based on the application needs.

The transformed matrix is then compressed 204 using an autoencoder. The autoencoder uses neural networks to compress the signals by finding the features that contain the most significant information. These will generally be the max scaled values of the matrix, i.e. the highest number of time constant samples measured with the same values. This can be depicted as the highest intensity values within a 3D mapped image plot of the measured signature, with the third dimension data being the intensity values for corresponding x-y values. The autoencoder also forces the neural network to use less features in the hidden nodes, i.e. the low intensity regions of the plot. The number of nodes generated at the output (output nodes) of the edge device 101 is the same as the number of input nodes received at the remote server 102. Thus, half of the autoencoder compresses the signal at the edge device 101, while the other half of the autoencoder decompresses the signal at the remote server 102.

Figure 3:
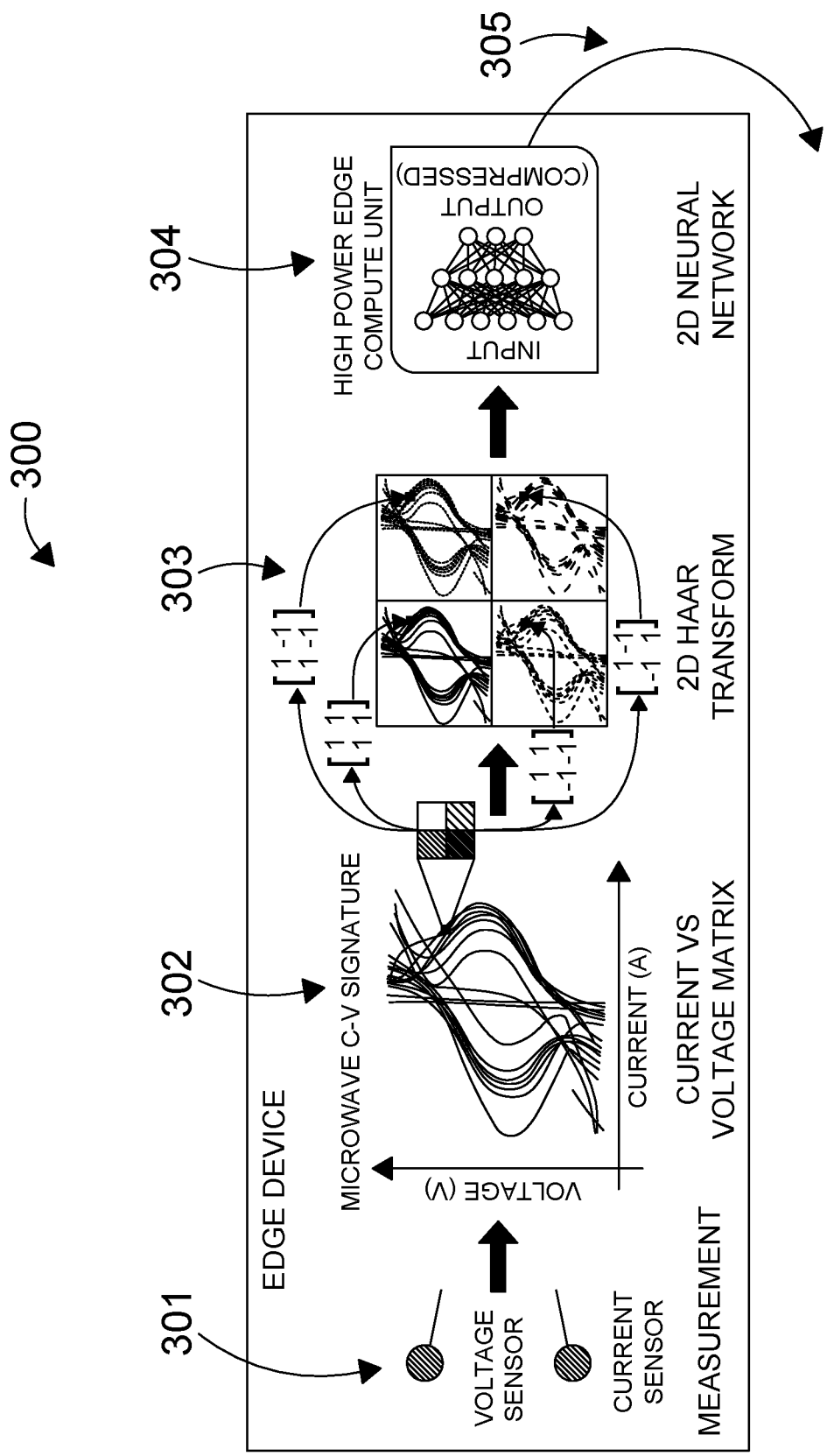
FIG. 3 is the compression at the edge device of the current-voltage signatures, as measured by the current and voltage sensors, of the example microwave appliance of FIG. 1.

In an example implementation of the disclosure, as shown in FIG. 3, the process 300 is applied to current and voltage signals of a microwave appliance 105. The current and voltage is measured by the corresponding sensors 301 and a 2D matrix is constructed of the periodic information inherent in AC current and voltage signals, as shown in 302 of FIG. 3. The intensity values within the plot in 302 of FIG. 3 corresponds to the number of times that a particular value has been captured and the x-y coordinates represent the current and voltage values. After generating these current-voltage signature plots the 2D Haar transform is applied, as shown in 303 of FIG. 3. The Haar transform is applied to a certain depth as determined by the algorithm. This results in a sparse 2D signal which is fed into a 2D neural network at the transmitter of the edge device within or connected to the microwave appliance. The 2D neural network is the compressive half of a pre-trained autoencoder and may be part of the high power edge compute unit. Thus, the part of the autoencoder residing on the edge device 101 is a neural network with an input layer (i.e. input data size) much larger than the output layer (i.e. output data size). The resultant encoded data of the measured properties of the microwave appliance 105 can then be transmitted to the remote server 102. In another example, the process may be applied to signals within an electric vehicle (EV), wherein data is collected from the sensors within the EV and then transmitted from the vehicle to a gateway, server or cloud. For system architectures where multiple devices are connected the analysis may be performed at the gateway of the connected devices and then transmitted from the gateway to the server or cloud.

Figure 4:
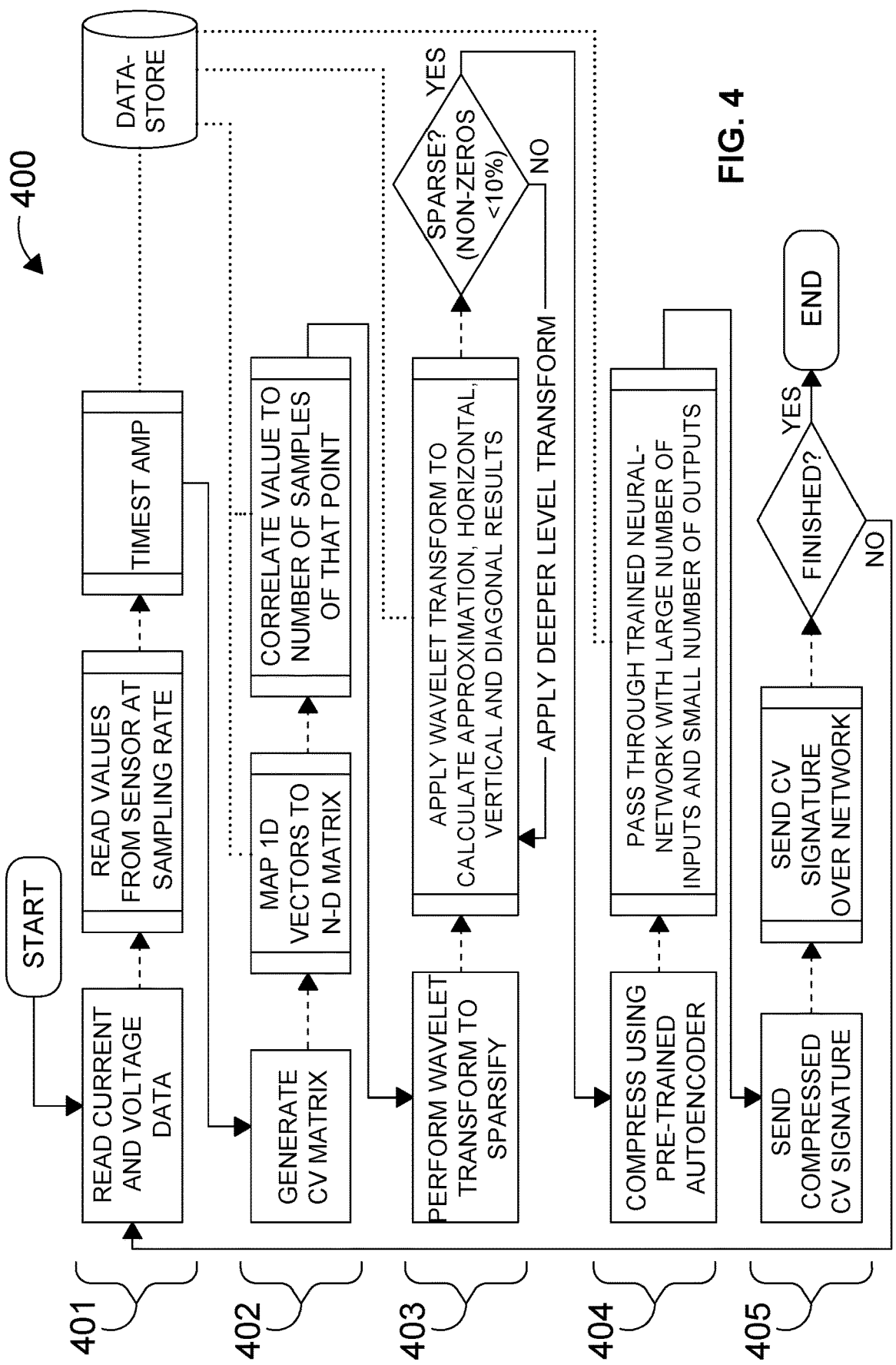
FIG. 4 is a flow diagram of the method steps for sensing, compressing and transmitting the data on the edge device.

FIG. 4 depicts the required method steps, of an aspect of the disclosure, to be implemented on the edge device 101. This is illustrated by the flow diagram 400 in FIG. 4. The steps 401-405 of FIG. 4, represent the acquisition, compression and transmission of the data at the edge device. In 401 the current and voltage data is read by the edge device 101, wherein the read values are acquired from the N sensors 104, at least two of which are current and voltage sensors 103, at a sampling rate or time instant. These current and voltage (I-V) values are marked by a timestamp, giving the I-V data a value in time. These timestamped I-V values are stored in a datastore. This storing of data may be temporary or long-term depending on the device, application and computing power. The collated timestamped data is regarded as a series of N one-dimensional vectors, which are then used to generate the N-dimensional matrix, as in 402. This reduces the amount of data significantly as any periodic information is compressed into a single value or point. Since the AC current and voltage signals are periodic, multimodal signals, a large compression can be achieved. After collecting a full window of samples, i.e. a set of N timestamped data within a particular time series, the samples are normalised with respect to the number of appearances. The value which appears most frequently will be the max value of 1 with the other values scaled accordingly. This allows a correlation to be determined for the number of samples occurring at a particular point.

At 403 of FIG. 4, in other words step 3 of the method, involves performing a wavelet transform to sparsify the matrix, for example using the Haar transform. The wavelet transform is applied to calculate the approximations of horizontal, vertical and diagonal results of the matrix (see 303 of FIG. 3). Applying the wavelet transform is repeated several times (i.e. multiple levels of the transform) until a sufficiently sparse output is achieved. This is an iterative process as shown in 403 of FIG. 4, where a deeper level transform is applied until the measured percentage of zeros is sufficient (e.g. non-zeros <10%). The level of depth of the transform depends on the application type and the type of data to be measured, for example data taken from current and voltage signals, and is known through training and/or experience. Both the edge device 101 and the remote server 102 use the same depth of transform in order to match the reconstructed data signature to the original data signature. This depth information of the transform is shared to both the edge device 101 and remote server 102 so the depth is known to both.

Step 4 of the method as depicted in 404 of FIG. 4 comprises compressing the sparsified data using a pre-trained neural network (e.g. an autoencoder). The pre-trained neural network implemented at this step is the first half of the pre-trained autoencoder, and may be part of the edge device 101 as discussed above. Details of pre-training the autoencoder are provided below. The compression of the sparsified data signal further aids in removing unnecessary information, as the data is passed through a neural network with a large number of inputs and a small number of outputs (see 304 of FIG. 3). Finally, the data is transmitted (305). The resulting compressed data is sent to a remote server over a network protocol, as in 405 of FIG. 4. Examples of suitable network protocols are WiFi, 4G, LTE-A, ethernet, etc. Others can be envisaged. The steps 1-5 may be repeated until the process is stopped, timed out, or, for example, the transfer of a finite set of data signatures has been completed.

Figure 5:
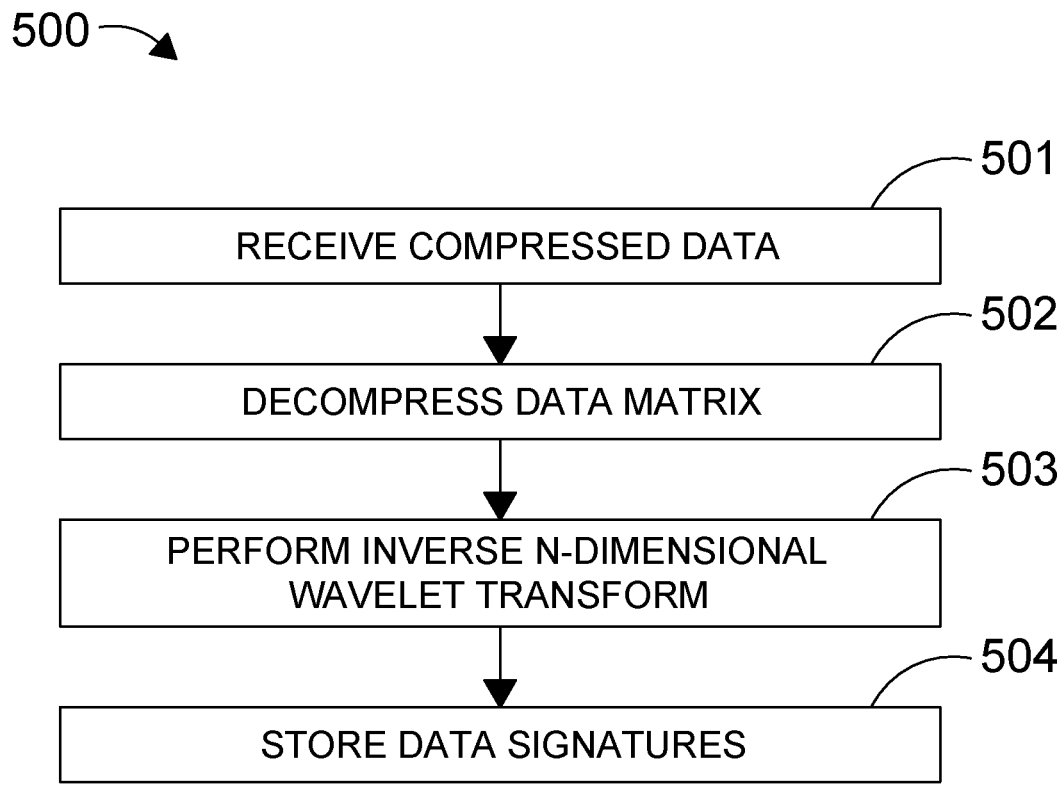
FIG. 5 is the process occurring at the remote server.

FIG. 5 illustrates via a flow diagram the process 500 occurring at the remote server (or cloud). The first step, as in 501, is to receive the compressed data signal as transmitted from an edge device 101. For example, this may be performed by a receiver at the remote server 102. Once received the remote server 102 stores the compressed data in a datastore before applying any of the techniques for restoring the data back to the original signal signature. The compressed data matrix is then decompressed using an autoencoder as in 502, i.e. the reverse of the process performed at the edge device 101, to retrieve the less significant information contained in the signals. The number of input nodes received by the remote server 102 is the same as the number of output nodes generated at the edge device 101. This decompression restores part of the original data within the data matrix, so that the data output of the autoencoder at the remote server 102, to be further decompressed, mirrors that of the data input of the autoencoder at the edge device 101. Thus, the hidden nodes which represent the lower values within the data matrix are recovered.

In the third step of the method the data is then transformed by performing an inverse N-dimensional wavelet transform, such as the Haar transform, as shown by 503 in the flow diagram of FIG. 5. This is performed to a certain depth, which is determined depending on the application but should match the depth of transformation applied at the edge device 101. The resulting data matrix is the normalised data matrix of the data representing the collected data (x1, x2, x3, . . . , xN) for each of the sensors (1, 2, 3, . . . , N), 104 connected to the edge device 101 at each time instant (xt) within the original predefined time duration. Finally, as shown in 504 of FIG. 5, the decompressed and transformed data, which represents the original time-series data signatures measured at the device or appliance 105, is stored within the data store of the remote server 102.

Figure 6:
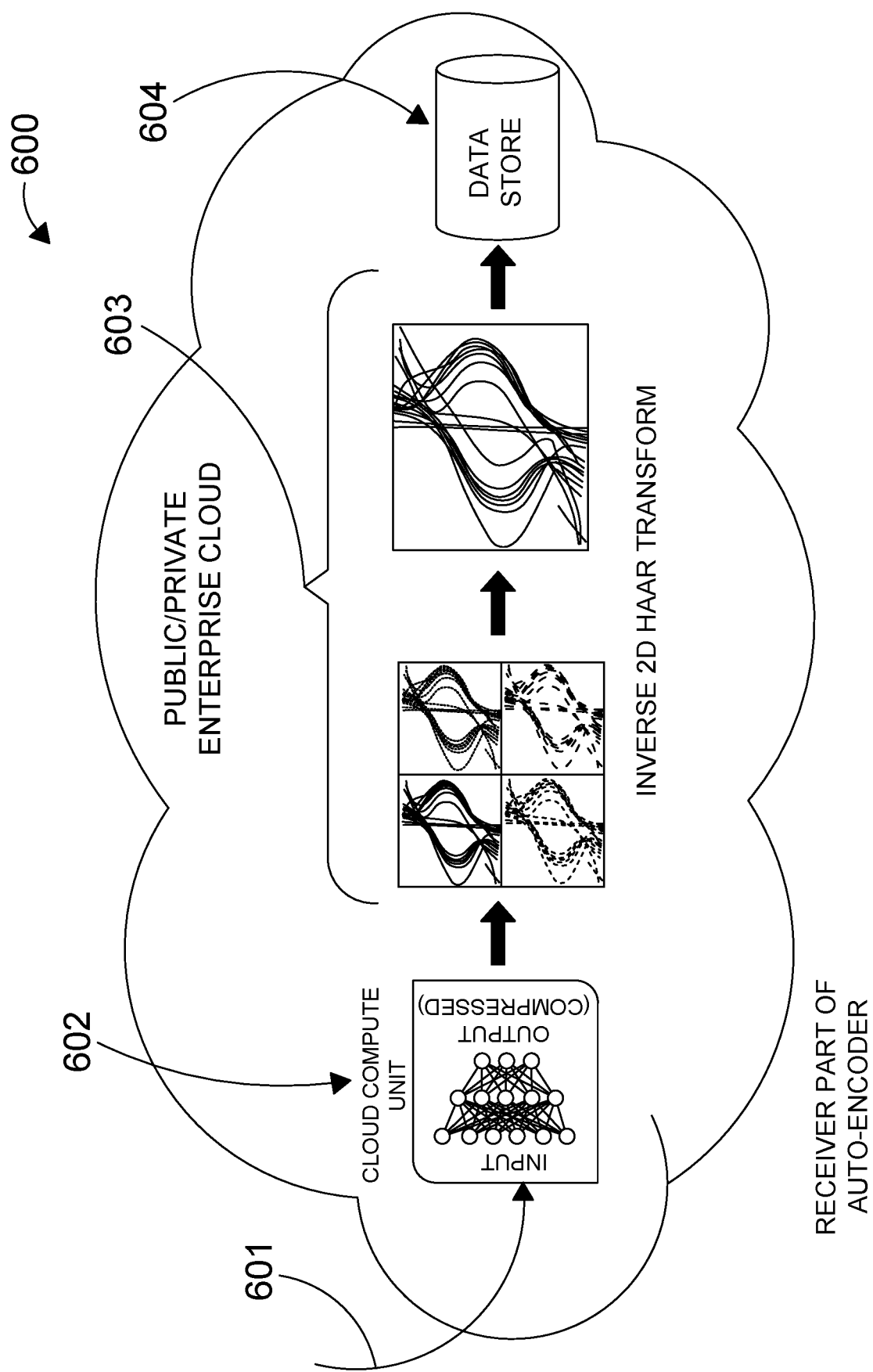
FIG. 6 is the decompression in the cloud of the compressed current-voltage signatures of the example microwave appliance.

In an example implementation of the disclosure, as shown in the schematic diagram 600 of FIG. 6, the process is applied to current and voltage signals of a microwave appliance 105 and the remote server 102 in this case is a cloud, such as a public or private enterprise cloud. This allows the properties of the microwave appliance 105 to be monitored and analysed remotely. FIG. 6 portrays the decompression steps of the method that occurs in the cloud 102 for the example microwave 105 current and voltage signals. The receiver part of the autoencoder 601, which may be part of the cloud compute unit 102, is shown with the input nodes of the received compressed data 602 as transmitted from the edge device 101. This is the inverse of the autoencoder on the edge device 101 (see 304 of FIG. 3), with neural network residing on the cloud 102 having an output layer (i.e. output data size) much larger than the input layer (i.e. input data size). Using the output data, an inverse 2D Haar transform is applied as shown in 603 of FIG. 6. The transform is performed to a certain depth as determined by the algorithm which is equivalent to the depth of the 2D Haar transform used at the edge device 101. The transformation results in the original current-voltage data matrix and signature plot, as in 302 of FIG. 3, corresponding to the determined current and voltage values as measured from the AC signal of the microwave appliance 105. The example current-voltage plot is shown in 603 of FIG. 6, and is comparable to the signature plot in 302 of FIG. 3 generated at the edge device 101. The resultant values are then stored in a data store 604 on the cloud 102 for subsequent analysis which has the ability to be carried out at any location, as long as the user has access to the data store of the cloud 102.

Figure 7:
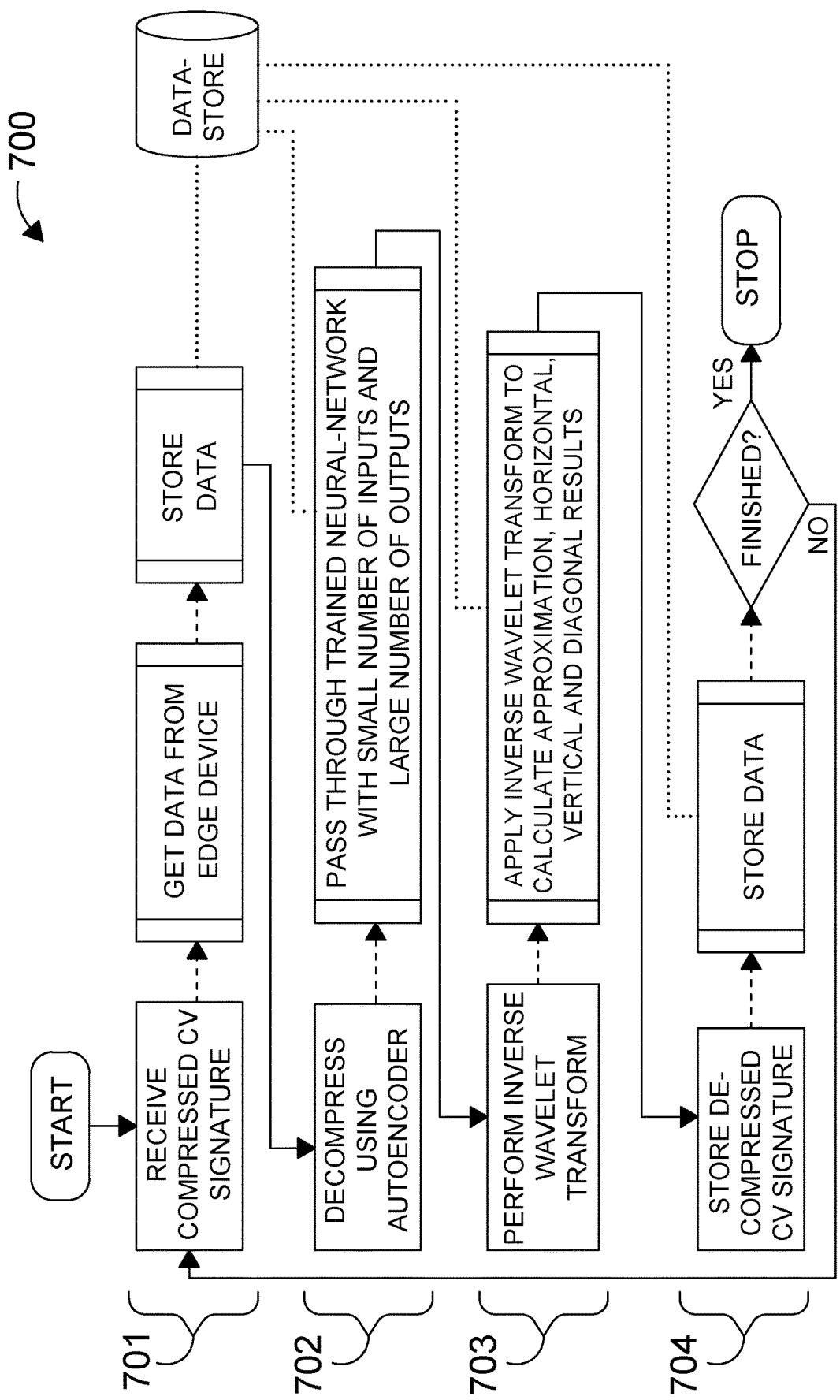
FIG. 7 is a flow diagram of the method steps for decompressing the data in the cloud server.

FIG. 7 depicts a flow diagram of the required method steps, of an aspect of the disclosure, to be implemented on the remote server 102. This is illustrated by 700 in FIG. 7. The method steps 1-4 of FIG. 7, referred to as 701-704, represent the procedure for decompression of the current-voltage signatures in the cloud server 102. In step 1, i.e. 701, the receiver element of the cloud 102 receives the compressed current-voltage signature as transmitted from the edge device 101 using a network protocol. Once the cloud 102 obtains the data sent by the edge 101 it is stored before the data is decompressed. The data may be stored temporarily or may be stored for an extended amount of time in a datastore located at the cloud server 102. The temporarily stored data is stored at least until enough data is received for a full window, which is equivalent to the windowed sample measured at the edge device 101. In 702 of the decompression procedure at the cloud server 102, the data is decompressed using the second half of the pre-trained autoencoder. The data is passed through the trained neural network with a small number of inputs and a large number of outputs. This is illustrated by 602 of FIG. 6. The resulting output data values are stored in the datastore. Again, the data may be stored temporarily or for an extended amount of time.

In FIG. 7, step 3 of the method, i.e. 703, involves performing an inverse wavelet transform to densify the matrix, for example using the inverse Haar transform. The inverse wavelet transform is performed a number of times, i.e. to a number of levels, equal to the depth used at the edge device 101. This is applied to calculate the approximations of horizontal, vertical and diagonal results of the matrix (see 603 in FIG. 6), recreating the original N-dimensional matrix which was generated at the edge device 101. Again, the values from the repeated application of the inverse wavelet transform may be stored in the datastore. Finally, in the fourth step of the method 704 performed at the remote server 102, the decompressed N-dimensional (i.e. current-voltage) signature of the N-dimensional matrix is stored in the datastore. The signature represents a unique event or state of some real world appliance, for example a microwave 105. If multiple appliances or devices are connected within a system architecture, such as PowerGenome, then several signatures may be compressed, transmitted, decompressed and then stored for later analysis. For example, decompressing the signals to get the current-voltage signatures, allows the characteristics of the machines, appliances or devices 105 to be studied, providing insights into the types of events occurring at the machine, appliance or device 105. An event may be considered as a device 105 turning on or off, or changing state. Having remote access to the multiple events occurring from multiple devices 105 connected in a system architecture provides a deeper insight into the operation and assessment of the network of devices 105 without the need for being on site. This saves time, energy and can help to improve efficiency within the system. Other benefits of implementing such a method may be realised depending on the application.

In order to implement the compression and transmission method and system, as discussed above, a pre-trained autoencoder is utilised and may be selected from a plurality of known autoencoders. The autoencoder may be a general, commonly used autoencoder and then customised for the specific application. An example training 800 of the autoencoder used within this disclosure is provided in the method steps 1-6 as represented by 801-806 of the flow diagram of FIG. 8. Training is required for both of the two halves of the autoencoder (edge 101 and cloud 102), with the method steps 801-806 comprising training each side together. The output layer nodes of the edge neural network are connected one-to-one to the input layer nodes of the neural network in the cloud. A gradient descent algorithm is used to update the weights of the nodes on both the edge 101 and cloud 102 sides of the autoencoder, with the objective to have the difference between the raw (input) data at the edge 101 and reconstructed (output) data at the cloud 102 minimised. This allows the reconstructed data to be comparable to the raw data with minimal error.

Figure 8:
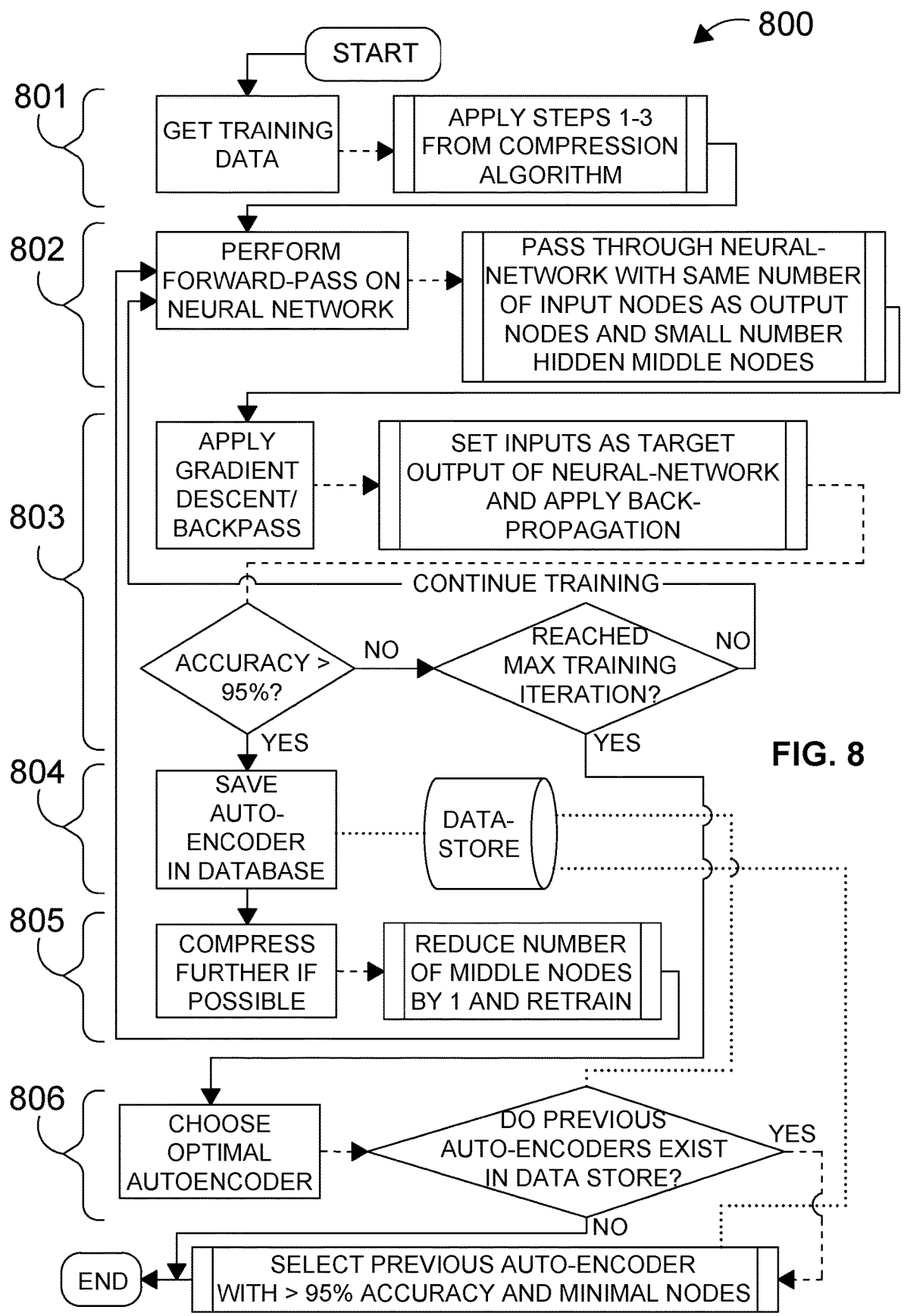
FIG. 8 is a flow diagram of the method steps for autoencoder training, customising for this specific application.

Starting at step 1, 801 of FIG. 8, the autoencoder receives the training data at the edge 101 side, where the data for the autoencoder training is the sparsified data matrix. This is obtained by executing the steps of the compression part of the method, as discussed above (see 301-303 of FIG. 3 and 401-404 of FIG. 4). Once the compression has been applied step 2 of the autoencoder training, i.e. 802, requires the data to be propagated forward in the neural network by performing a forward-pass. This forward pass through the neural network is performed with the same number of input nodes as output nodes and a small number of hidden nodes. Thus, the neural network is the coupling of the autoencoder at the edge device 101 with the autoencoder at the cloud 102.

A gradient descent or back-pass is then applied, as illustrated by 803 of the flow diagram of FIG. 8. The backward propagation is performed to enable the adjustment of the neural network weights. This is achieved by setting the inputs as target output of the neural network and applying back-propagation. If the desired level of accuracy is reached (e.g. accuracy >95%), step 4 of the method may be performed, as shown in 804 of FIG. 8. However, if a predetermined maximum number of iterations has not been reached, steps represented by 802 and 803 are performed again, and training continues. The number of iterations may be defined by the user. If the desired accuracy has not been obtained and the maximum number of iterations has been reached the algorithm proceeds to 806.

In 804 of FIG. 8 the trained autoencoder is saved in a database with the autoencoder weights and structure. This is then stored in a datastore. Step 5, 805 of FIG. 8, comprises compressing the data of the autoencoder further by reducing the number of nodes in the middle layer of the autoencoder. The middle layer data corresponds to the output values of the compression algorithm. The number of middle nodes is reduced sequentially by 1 and the autoencoder is retrained on each iteration of reduction. The retraining comprises performing the second, third and fourth method steps, i.e. 802, 803 and 804, again. Once the autoencoder cannot be compressed further the algorithm goes from 804 to 806 of the flow diagram. Step 6 of the method, as in 806 of FIG. 8, involves choosing the optimal encoder for the particular application. If no previous autoencoders have been stored in the datastore, it is not possible to create an autoencoder that compresses the specific input data with the desired accuracy, i.e. it is best to have a plurality of autoencoders stored. In the situation where no previous autoencoder is stored, and the newly compressed autoencoder does not achieve a satisfactory accuracy, the above described training method cannot be used. In this case, either the accuracy has to be reduced or a different compression method needs to be used. If multiple autoencoders exist, the autoencoder with highest accuracy (e.g. >95% accuracy) and minimal nodes will be selected. Therefore, this pre-trained autoencoder will be used in the transmission of data (e.g. current-voltage signatures) between an edge device 101 and a remote server or cloud 102.

The invention claimed is:

1. A data transmission and compression method arranged to compress and transmit data between an edge device and a remote server, the method comprising:
   collecting data at the edge device, wherein the data comprises a plurality of data signatures, wherein the collected data signatures comprise measurement data from a plurality of N correlated sensors at the edge device, and wherein the data signatures are periodic signals collected as a time series;
   generating an N-dimensional data matrix at the edge device, comprising incrementing by one a position in the data matrix every time instant collected data values from the N correlated sensors correspond to that position over a predefined time duration, and scaling the values of the data matrix between zero and one depending on a maximum value recorded in the data matrix;
   transforming the data matrix, wherein transforming the data matrix comprises using a wavelet transform and wherein the step of transforming the data comprises sparsifying the data matrix to obtain a sparsified data matrix;
   compressing data of the sparsified data matrix to obtain encoded compressed data, wherein compressing the data comprises utilizing an autoencoder;
   transmitting the encoded compressed data to the remote server via a communication channel;
   at the remote server, decompressing the encoded compressed data utilizing an autoencoder;
   reconstructing the data signatures using an inverse wavelet transform to obtain reconstructed signal signatures; and,
   storing the reconstructed signal signatures in a datastore on the remote server.

2. The method of claim 1, wherein the collected data signatures comprise voltage and current signals.

3. The method of claim 1, wherein the data collected is measured raw data.

4. The method of claim 1, wherein the time-series compromises difference values ($\Delta x$) for succeeding measurements, such that $x_2 = x_1 + \Delta x_1$, $x_3 = x_2 + \Delta x_2$, $x_4 = x_3 + \Delta x_3$, wherein $\Delta x$ can be a positive or negative integer.

5. The method of claim 1, wherein the edge device comprises an embedded device.

6. The method of claim 1, wherein the transmission is over a network protocol.

7. The method of claim 1, wherein the data is collected from a PowerGenome architecture.

8. The method of claim 1, wherein the autoencoder on the edge device comprises a neural network with an input layer.

9. The method of claim 1, wherein the autoencoder on the remote server comprises a pre-trained neural network.

10. A data transmission and compression system arranged to compress and transmit data via a communication channel between an edge device comprising a plurality of N correlated sensors and a remote server, comprising:
    an edge device, wherein the edge device is configured to:
       collect a plurality of data signatures, wherein the collected data signatures comprise measurement data from a plurality of N correlated sensors at the edge device, and wherein the data signatures are periodic signals collected as a time series,
       generate an N-dimensional data matrix, increment by one a position in the data matrix every time instant collected data values from the N correlated sensors correspond to that position over a predefined time duration, and scale the values of the data matrix between zero and one depending on a maximum value recorded in the data matrix,
       transform data of the data matrix using a wavelet transform and sparsify the data matrix to obtain a sparsified data matrix, and
       compress data of the sparsified data matrix utilizing an autoencoder to obtain encoded compressed data,
       wherein the edge device includes a transmitter that transmits the encoded compressed data to the remote server via the communication channel; and
    a remote server comprising a receiver, wherein the remote server is configured to:
       decompress the data using an autoencoder to obtain decompressed data, and
       reconstruct the data signatures using inverse wavelet transform to obtain reconstructed data signatures,
       wherein the remote server includes a datastore and reconstructed data signatures are stored in the datastore.

11. A data transmission and compression method arranged to compress and transmit data between an edge device and a remote server, the method comprising:

collecting data at the edge device, wherein the data includes a plurality of data signatures, wherein the collected data signatures comprise measurement data from a plurality of N correlated sensors at the edge device, and wherein the data signatures are periodic signals collected as a time series;

generating an N-dimensional data matrix at the edge device, wherein the data matrix has a number of rows corresponding to a number of time instants at which data is collected over a predefined time duration, and wherein generating the data matrix includes scaling the values of the data matrix between zero and one depending on a maximum value recorded in the data matrix;

transforming the data matrix, wherein transforming the data matrix comprises using a wavelet transform and wherein the step of transforming the data includes sparsifying the data matrix to obtain a sparsified data matrix;

compressing data of the sparsified data matrix to obtain encoded compressed data, wherein compressing the data comprises utilizing an autoencoder;

transmitting the encoded compressed data to the remote server via a communication channel;

the method further comprising, at the remote server, decompressing the encoded compressed data utilizing an autoencoder;

reconstructing the data signatures using an inverse wavelet transform to obtain reconstructed signal signatures; and, storing the reconstructed signal signatures in a datastore on the remote server.

* * * * *